United States Patent [19]

Matsuura

[11] Patent Number: 4,593,255
[45] Date of Patent: Jun. 3, 1986

[54] VARACTOR TUNED COLPITTS OSCILLATOR WITH COMPENSATING VARACTOR FOR WIDE BAND WIDTH

[75] Inventor: Syuuji Matsuura, Ikoma, Japan
[73] Assignee: Sharp Kabushiki Kaisha, Osaka, Japan
[21] Appl. No.: 470,960
[22] Filed: Mar. 1, 1983

[30] Foreign Application Priority Data

May 17, 1982 [JP] Japan .................................. 57-83691

[51] Int. Cl.$^4$ ............................................. H03B 5/12
[52] U.S. Cl. ............................ 331/117 R; 331/177 V; 334/15
[58] Field of Search ............... 331/109, 117 R, 177 V, 331/179, 183; 334/15

[56] References Cited

U.S. PATENT DOCUMENTS

| | | | |
|---|---|---|---|
| 3,370,254 | 2/1968 | Keller | 332/30 V |
| 3,825,858 | 7/1974 | Amemiya et al. | 331/117 R |
| 4,430,630 | 2/1984 | Sakamoto | 334/15 |

FOREIGN PATENT DOCUMENTS

| | | | |
|---|---|---|---|
| 2105151 | 2/1971 | Fed. Rep. of Germany | 334/15 |
| 2501818 | 7/1975 | Fed. Rep. of Germany | 331/117 R |
| 2918636 | 11/1980 | Fed. Rep. of Germany | 334/15 |
| 0034549 | 3/1980 | Japan | 331/117 R |
| 0093317 | 7/1980 | Japan | 334/15 |
| 0114025 | 9/1980 | Japan | 331/117 R |

*Primary Examiner*—Eugene R. LaRoche
*Assistant Examiner*—D. C. Mis
*Attorney, Agent, or Firm*—Birch, Stewart, Kolasch & Birch

[57] ABSTRACT

An oscillation circuit includes as its principal components a Clapp capacitor and two feedback capacitors connected to each other and a resonance coil. A first series circuit including a first variable-capacitance diode and a first DC cutoff capacitor is connected in parallel with the resonance coil, while a second series circuit including a second variable-capacitance diode and a second DC cutoff capacitor is connected to a first diode such that a certain polarity terminal of the second variable-capacitance is faced against the same polarity terminal of the first diode. One end of the second DC cutoff capacitor in the second series circuit is connected to the one of the feedback capacitors. Furthermore, means is provided at the joint of the first variable-capacitance diode and the first DC cutoff capacitor for applying a DC voltage to enable the first and second variable-capacitance diodes.

1 Claim, 6 Drawing Figures

VARACTOR TUNED COLPITTS OSCILLATOR WITH COMPENSATING VARACTOR FOR WIDE BAND WIDTH

BACKGROUND OF THE INVENTION

This invention relates to an oscillator of an LC resonance type and, more particularly to an improvement in a Colpitts type oscillation circuit.

FIG. 1 illustrates a conventional Colpitts oscillator for use in local oscillation in electronic tuning TV tuners or other applications. This circuit design includes feedback capacitors 11 and 12, a Clapp capacitor 14 and bias resistors 21, 22, 23 and 24 for an oscillating transistor Tr. A diode 31 is used for band switching and especially operates to bring a coil 29 into a shunt state with respect to high frequency components when forward current flows through the diode 31 in a path including a terminal $T_2$, a resistor 26, the diode 31, a coil 29, a resistor 27 and a terminal $T_1$. A coil 28 is the only resonance coil which operates under this circumstance, so that the circuit arrangement is ready to receive a high band of broadcasts. A DC voltage is applied between the terminals $T_1$ and $T_2$, then to place the diode 31 into a nonconductive state so that both the coils 28 and 29 become operative. The inductance of the resonance circuit thereby increases to be equal to the sum of the inductances $L_1$ and $L_2$ of the coils 28 and 29 (i.e. $L_1+L_2$). As a result, the circuit arrangement is ready to receive a low band of broadcasts. It is noted that the resonance frequency is determined by the inductance $L_1$ or $L_1+L_2$ together with factors of a variable-capacitance diode 30, a DC cutoff capacitor 15, the Clapp capacitor 14 and the FIG. 2 shows an equivalent circuit of the oscillator circuit of FIG. 1. The inductance $L_0$ of a coil 32 represents the above mentioned inductance $L_1$ or $L_1+L_2$. A terminal $T_0$ is a power supply terminal for the oscillating transistor Tr.

A series circuit of the variable-capacitance diode 30 and the DC cutoff capacitor 15, combined with the inductance $L_1$ or $L_1+L_2$, form a tank circuit of a parallel resonance connection. The oscillating frequency is varied with the capacitance $D_1$ of the variable-capacitance diode 30 which in turn is governed by an applied voltage to a terminal $V_T$.

Generally speaking, in the case of an oscillation circuit where the resonance frequency is varied with the capacitance C of the tank circuit while its inductance L is fixed, intensity and stability of oscillation are dependent greatly upon frequency due to the frequency characteristics of the oscillating transistor used, the frequency-dependent Q value of the tank circuit and the frequency dependency of the resonance impedance.

Considering the characteristics of the tank circuit, the Q value is represented by $$\frac{\sqrt{L/C}}{r}$$

and the resonance impedance by L/cr where r is the equivalent DC resistance of the coil. The Q value and the resonance impedance both decrease with an increase in the capacitance C. Especially when the variable-capacitance diode is used as a factor-varying element, the frequency and capacitance dependent Q value of the variable-capacitance diode would emphase the above tendency for the Q value of the tank circuit and the resonance impedance.

For an oscillator which is used in a local oscillation circuit of an electronic tuning TV tuner and meets the demand for wide range reception in respective bands, for example, VHF and CATV bands (typically, $B_1$ band: 55–108 MHz, $B_2$ band: 109–216 MHz and $B_3$ band: 217–440 MHz, each band encompasses substantially a two-fold frequency width), it is necessary to use a variable capacitance diode which has a width of capacitance variation approximately one and half times as great as that used with a conventional VHF band receiver.

This necessity results in the wider variation of the Q value and greater difficulties in ensuring constant oscillating conditions throughout all of the relevant frequency bands.

OBJECT AND SUMMARY OF THE INVENTION

Accordingly, it is an object of the present invention to provide an oscillation circuit which overcomes the above discussed problems and especially assures stability of oscillation over a wider range of frequency than the conventional oscillation circuit.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

According to an embodiment of the present invention, an oscillation circuit includes as its principal components a Clapp capacitor, two feedback capacitors connected to each other and a resonance coil. A first series circuit including a first variable-capacitance diode and a first DC cutoff capacitor is connected in parallel with the resonance coil, while a second series circuit including a second variable-capacitance diode and a second DC cutoff capacitor is connected to a first diode such that a certain polarity terminal of the second variable-capacitance diode is faced against the same polarity terminal of the first diode. One end of the second DC cutoff capacitor in the second series circuit is connected to the one of the feedback capacitors. Furthermore, means is provided at the joint of the first variable-capacitance diode and the first DC cutoff capacitor for applying a DC voltage to enable the first and second variable-capacitance diodes.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 1:
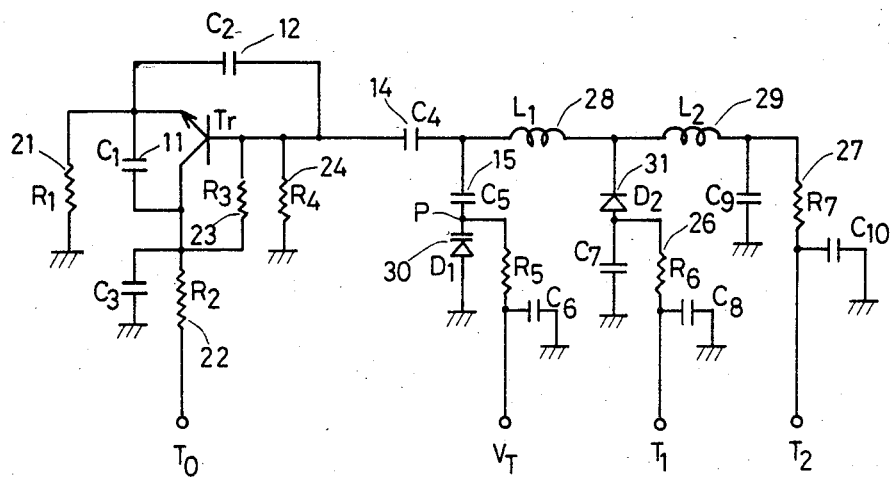
FIG. 1 is a circuit diagram of a conventional Colpitts oscillator.
Figure 2:
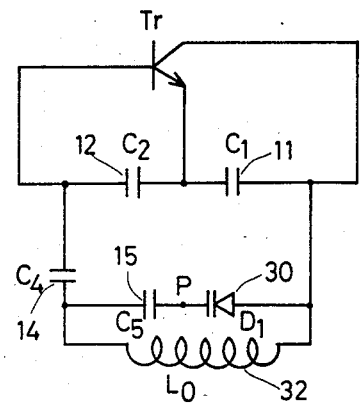
FIG. 2 is an equivalent circuit diagram of the oscillator of FIG. 1.
Figure 3:
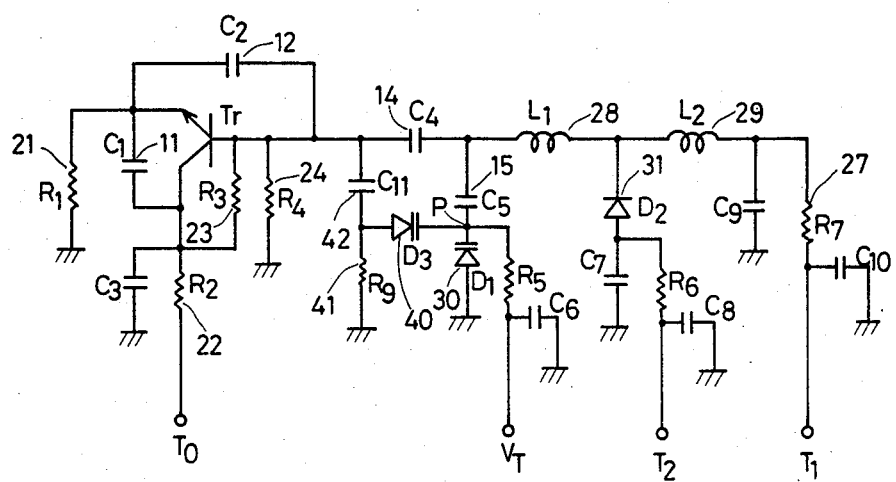
FIG. 3 is a circuit diagram of an oscillator according to an embodiment of the present invention.

Specific embodiments of the present invention will now be discussed. In FIG. 3, there is shown a circuit diagram of an oscillator according to an embodiment of the present invention. A series circuit of a variable-capacitance diode 40 and a DC cutoff capacitor 42 is connected such that the same polarity of the variable-capacitance diodes 30 and 40 are directed toward a same point P (i.e. the joint P of the variable-capacitance diode 30 and the DC cutoff capacitor 15 in the circuit of FIG. 1.) One end of the DC cutoff capacitor 42 is connected to a feedback capacitor 12 which is connected to a Clapp capacitor 14.

A resistor 41 in FIG. 3 is inserted to regulate the range of variations in the capacitance of the variable-capacitance diode 40. A DC voltage to the variable-capacitance diodes 30 and 40 is fed from a common terminal $V_T$.

With such an arrangement, the capacitance defined by the following relation is added in parallel with the Clapp capacitor 14.

$$\frac{1}{\frac{1}{C_{11}} + \frac{1}{D_3} + \frac{1}{C_5}} \approx \frac{1}{\frac{1}{C_{11}} + \frac{1}{D_3}}, (C_{11} << C_5)$$

where $D_3$ is the capacitance of the variable-capacitance diode 40, $C_{11}$ is the capacitance of the DC cutoff capacitor 42 and $C_5$ is the capacitance of the DC cutoff capacitor 15.

Figure 4:
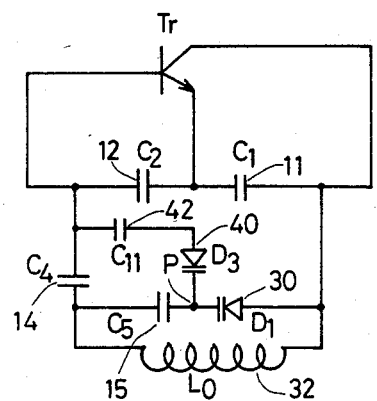
FIG. 4 is an equivalent circuit diagram of the oscillator of FIG. 3.

The impact of the varying capacitance of the variable-capacitance diode 30 on the Q value of the tank circuit and the resonance impedance is therefore offset when the parallel capacitance of the Clapp capacitor 14 is varied with the variable-capacitance diode 40. Stable oscillation is guaranteed over the whole range of frequency which may be swept by varying the capacitance of the variable-capacitance diode 30. FIG. 4 is an equivalent circuit diagram of the oscillator of FIG. 3.

Figure 5:
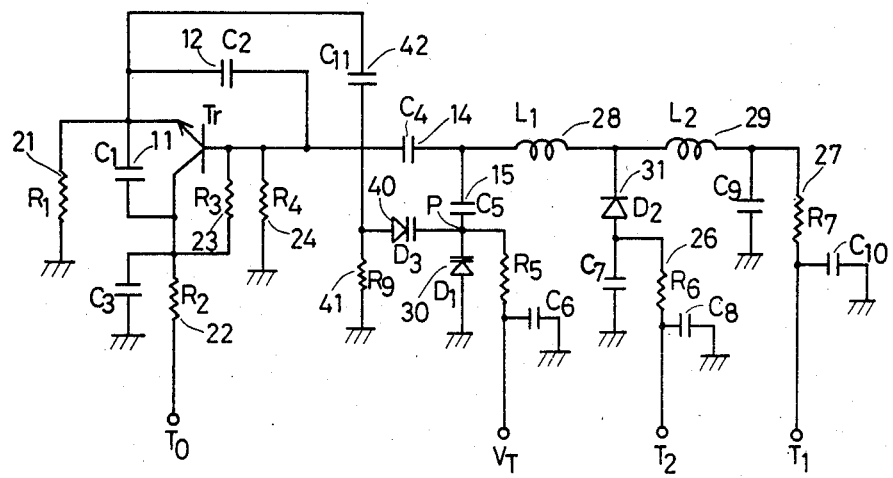
FIG. 5 is a circuit diagram of an oscillator according to another embodiment of the present invention.
Figure 6:
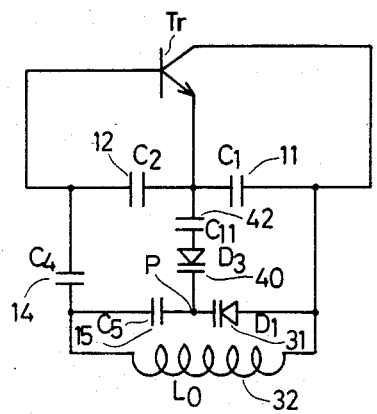
FIG. 6 is an equivalent circuit diagram of the oscillator of FIG. 5.

An oscillator according to another embodiment of the present invention and its equivalent circuit are illustrated in FIGS. 5 and 6. A variable-capacitance diode 40 in a series circuit additionally including a DC cutoff capacitor 42 is connected to another variable-capacitance diode 30 such that the same polarity of the two variable-capacitance diodes 30 and 40 is faced to face. One end of the DC cutoff capacitor 42 is connected to a feedback capacitor 12 which in turn is connected to a Clapp capacitor 14. With this connection, the varying capacitance of the variable-capacitance diode 40 permits the capacitance of the feedback circuit to vary. Even if the Q value of the tank circuit declines with an increase in the capacitance of the variable-capacitance diode 30, the simultanous increase in the capacitance of the variable-capacitance diode 40 increases the amount of feedback in the oscillator and thus decreases the impedance of the circuit viewed from the tank circuit side. This decrease compensates for the effect of the Q value and the resonance impedance so declined.

As noted earlier, the present invention is very beneficial to the circuit which demands stable oscillation over a wide range of frequency for use in a local oscillation section of TV receivers including CATV bands, for example, since it offers the variable-capacitance type oscillator capable of oscillating in a wide range of frequency with a higher degree of stability.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An oscillation circuit includes as its principal components Clapp capacitor means, amplifier means, two feedback capacitor means connected to each other and resonance coil means, said oscillation circuit comprising:

first variable-capacitance diode means;
first capacitor means, to form first series circuit including the first variable-capacitance diode means and the first capacitor means, is connected in parallel with the resonance coil means;
second variable-capacitance diode means;
second capacitor means to form second series circuit including the second variable-capacitance diode means and the second capacitor means; and
means for applying a voltage to enable the first and the second diode means,
wherein one end of the second diode means of the second series circuit is connected to the first diode means such that a certain polarity terminal of the second diode means is faced against the same polarity terminal of the first diode means, and one end of the second capacitor means of the second series circuit is connected with the feedback capacitor means connected to the Clapp capacitor means.

* * * * *